US009001275B2

(12) United States Patent
Kim et al.

(10) Patent No.: US 9,001,275 B2
(45) Date of Patent: Apr. 7, 2015

(54) METHOD AND SYSTEM FOR IMPROVING AUDIO FIDELITY IN AN HDMI SYSTEM

(71) Applicants: Andrew Joo Kim, Suwanee, GA (US); David Anthony Stelliga, Santa Clara, CA (US)

(72) Inventors: Andrew Joo Kim, Suwanee, GA (US); David Anthony Stelliga, Santa Clara, CA (US)

( * ) Notice: Subject to any disclaimer, the term of this patent is extended or adjusted under 35 U.S.C. 154(b) by 90 days.

(21) Appl. No.: 14/084,463

(22) Filed: Nov. 19, 2013

(65) Prior Publication Data

US 2014/0139743 A1 May 22, 2014

Related U.S. Application Data

(60) Provisional application No. 61/728,140, filed on Nov. 19, 2012.

(51) Int. Cl.
*H04N 5/00* (2011.01)
*H04N 21/43* (2011.01)
*H04N 21/439* (2011.01)

(52) U.S. Cl.
CPC ......... *H04N 21/439* (2013.01); *H04N 21/4305* (2013.01)

(58) Field of Classification Search
USPC ......... 348/607, 662, 682, 687, 521, 525, 515, 348/554, 441, 445, 455, 464, 462, 372, 725, 348/730, 711, 713, 733, 656, 505, 571, 348/409.1, 497, 133, 718, 723, 737; 375/354, 353, 355, 362, 364, 375, 376, 375/371; 370/516, 503
See application file for complete search history.

(56) References Cited

U.S. PATENT DOCUMENTS

| | | | |
|---|---|---|---|
| 6,329,850 B1 * | 12/2001 | Mair et al. ............... | 327/107 |
| 6,631,144 B1 * | 10/2003 | Johansen ............... | 370/516 |
| 6,914,637 B1 * | 7/2005 | Wolf et al. ............... | 348/473 |
| 2002/0163598 A1 * | 11/2002 | Pasqualino ............... | 348/725 |
| 2009/0251602 A1 * | 10/2009 | Williams et al. ............... | 348/521 |
| 2012/0147266 A1 * | 6/2012 | Sridharan et al. ............... | 348/515 |
| 2012/0182473 A1 * | 7/2012 | Kim et al. ............... | 348/521 |

* cited by examiner

*Primary Examiner* — Jefferey Harold
*Assistant Examiner* — Mustafizur Rahman
(74) *Attorney, Agent, or Firm* — Trellis IP Law Group, PC

(57) ABSTRACT

HDMI is a digital audio and video communications protocol commonly used in consumer electronics. HDMI is particularly synonymous with high fidelity audio and video. Even though HDMI is a digital communications protocol, the audio quality can be impaired by analog signal impairments and distortions even if there are no digital decoding errors. In particular, the very process by which the audio is converted from Digital (HDMI) to human audible "Analog Audio" can be prone to errors. This occurs when the Digital to Analog Converter (DAC) clock, which is derived from the HDMI TMDS clock or HDMI source, is "distorted" due to its jitter, resulting in erroneous sampling or outputting of vital audio samples, thereby reducing the audio quality of the experience. The present invention reduces the jitter on the TMDS clock, and hence the audio DAC clock, resulting in lower audio distortion. Exemplary simple embodiments of the present invention in an HDMI cable can dramatically improve audio fidelity in existing home entertainment systems without an upgrade to expensive major equipment replacement such as the source (audio system) or sink (Television).

18 Claims, 7 Drawing Sheets

Figure 1 – Prior Art

Figure 7-2 Optional Implementation: Audio Sink

METHOD AND SYSTEM FOR IMPROVING AUDIO FIDELITY IN AN HDMI SYSTEM

CROSS REFERENCES TO RELATED APPLICATIONS

This application claims priority from U.S. Provisional Patent Application Ser. No. 61/728,140 entitled "METHOD AND SYSTEM FOR IMPROVING AUDIO FIDELITY IN AN HDMI SYSTEM", filed on Nov. 19, 2012, which is hereby incorporated by reference as if set forth in full in this application for all purposes.

FIELD OF THE INVENTION

The present invention relates in general to media systems using digital audio and/or video data such as in the HDMI protocol. More specifically, the invention relates to a method and system for improving the audio fidelity in an HDMI system by reducing the jitter on the TMDS clock signal, resulting in a reduction of jitter on the audio DAC clock and a consequent improvement in audio fidelity.

EMBODIMENTS OF THE INVENTION

Figure 1:
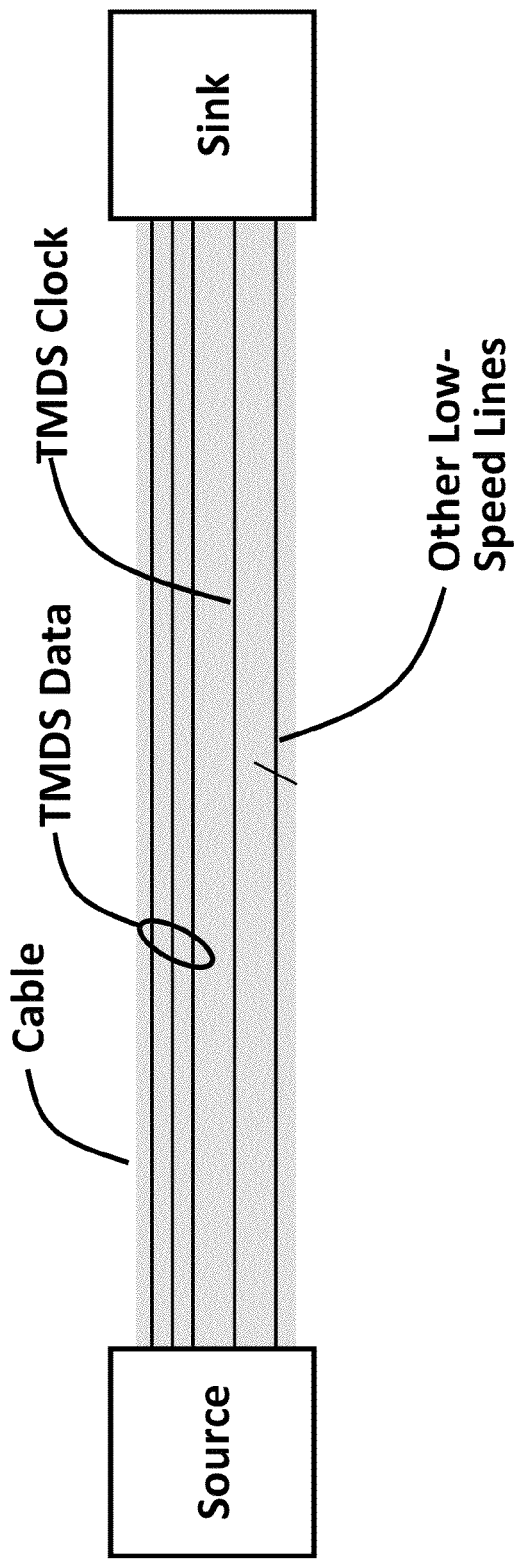
FIG. 1 illustrates an exemplary link for an HDMI interface.

High-Definition Multimedia Interface (HDMI) is a standard for digitally transmitting audio and video data from audiovisual sources to audiovisual displays. An exemplary link is illustrated in FIG. 1 showing the main components: the source (e.g. a DVD player, BluRay Disc player, or set-top box); the cable; and the sink (e.g. a television, projector, and/or speaker system). The HDMI standard uses Transition Minimized Differential Signaling (TMDS) to carry audiovisual data from the source to the sink. The TMDS data is carried over an HDMI cable via four differential signals: TMDS Clock, TMDS Data0, TMDS Data1, and TMDS Data2, where the latter three are commonly abbreviated as TMDS Data. The TMDS Clock is a lower speed than the data (typically 25 MHz to 340 MHz) rate clock that is synchronous with the TMDS Data lines.

Figure 2:
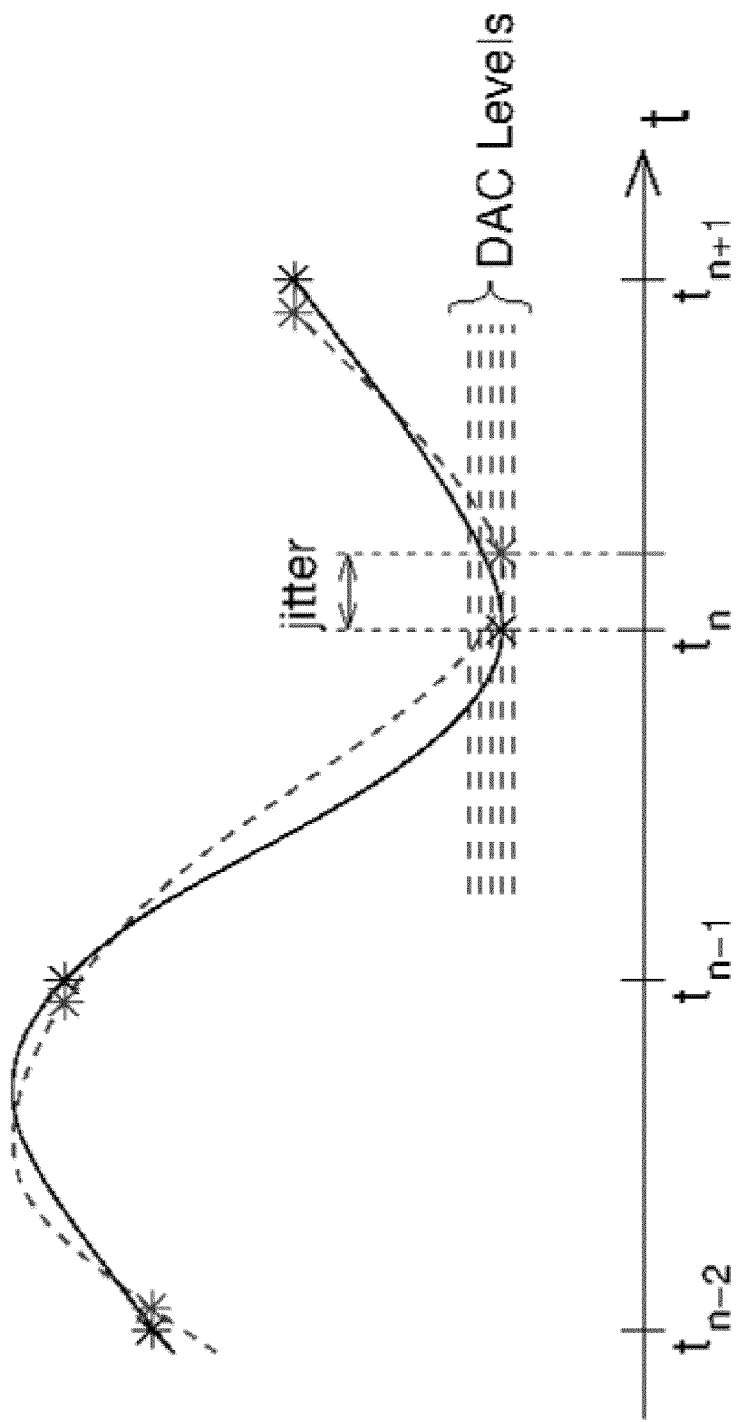
FIG. 2 illustrates reconstructed audio waveforms using ideal and perturbed time points.

The digital audio data in HDMI is carried from the source to the sink over the TMDS Data lines in dedicated audio frames. At the sink, the digital audio data is converted to an analog signal and driven to an amplifier and then on to a speaker system, that may comprise as many as 7 speakers. The digital-to-analog conversion is performed by a digital-to-analog converter (DAC) that generates the audio waveforms by reconstructing the signal amplitudes at prescribed time points. FIG. 2 illustrates this reconstructed waveform when using ideal time points ( . . . , $t_{n-1}$, $t_n$, $t_{n+1}$, . . . ) in the solid black curve. Also illustrated in FIG. 2 in the dashed red curve is how a perturbation of the ideal time points ( . . . , $t_{n-1}$, $t_n$, $t_{n+1}$, . . . ) by jitter, even though the DAC uses the exact same amplitude levels, can result in a different waveform and audio distortion. The resulting deviation can exceed the least significant bits of the DAC thus rendering them useless. HDMI commonly uses 16-bit audio, the lowest order bit of which can be distorted by 0.5 nanoseconds ($5*10^{-8}$ seconds) of jitter. Additionally, HDMI supports even higher fidelity 24-bit audio, the lowest order bit of which can be distorted by 2 picoseconds ($2*10^{-12}$ seconds) of jitter. As is known in the industry (e.g., reference: http://www.madronadigital.com/Library/DigitalAudioJitter.html) there exist HDMI sources that can exhibit several nanoseconds of jitter which can reduce the fidelity of a 24-bit audio link to one worse than a standard clean 16-bit audio link.

Figure 3:
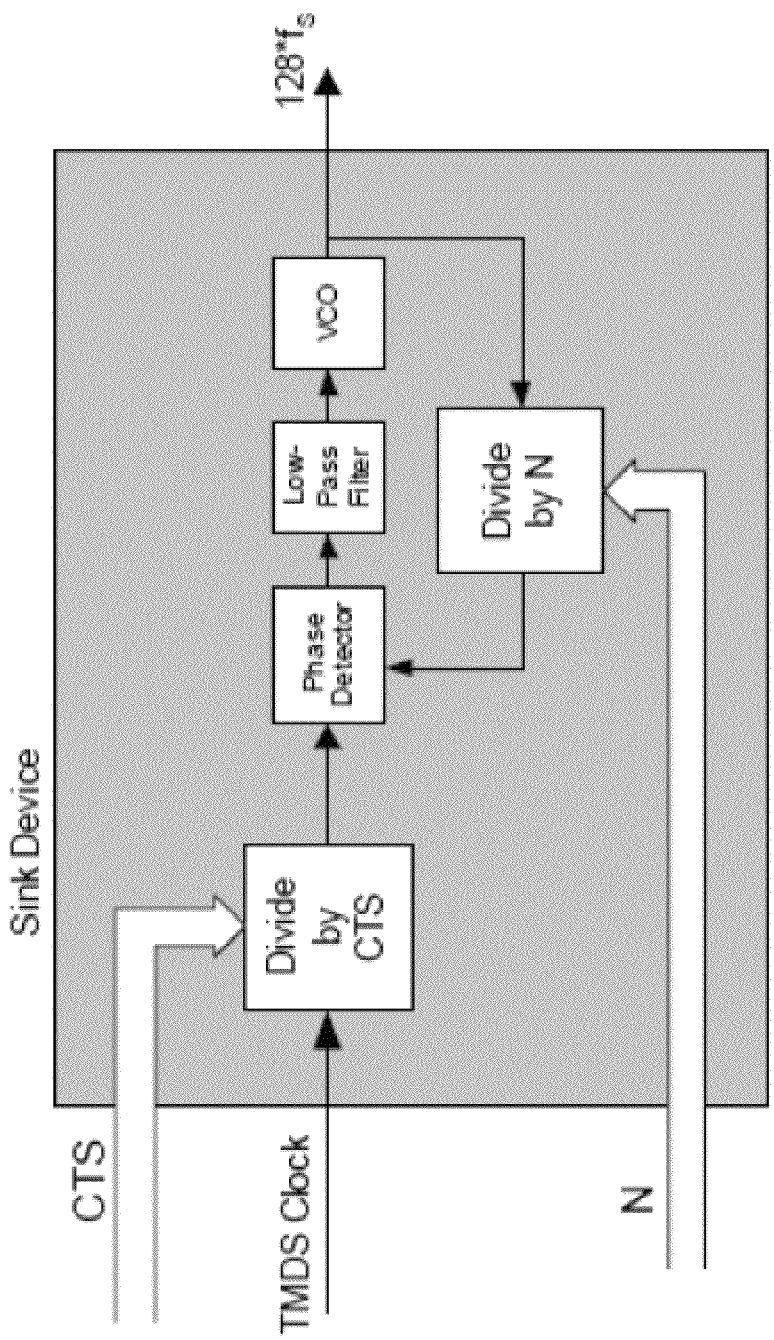
FIG. 3 illustrates a sink implementation for generating an audio DAC clock.
Figure 7:
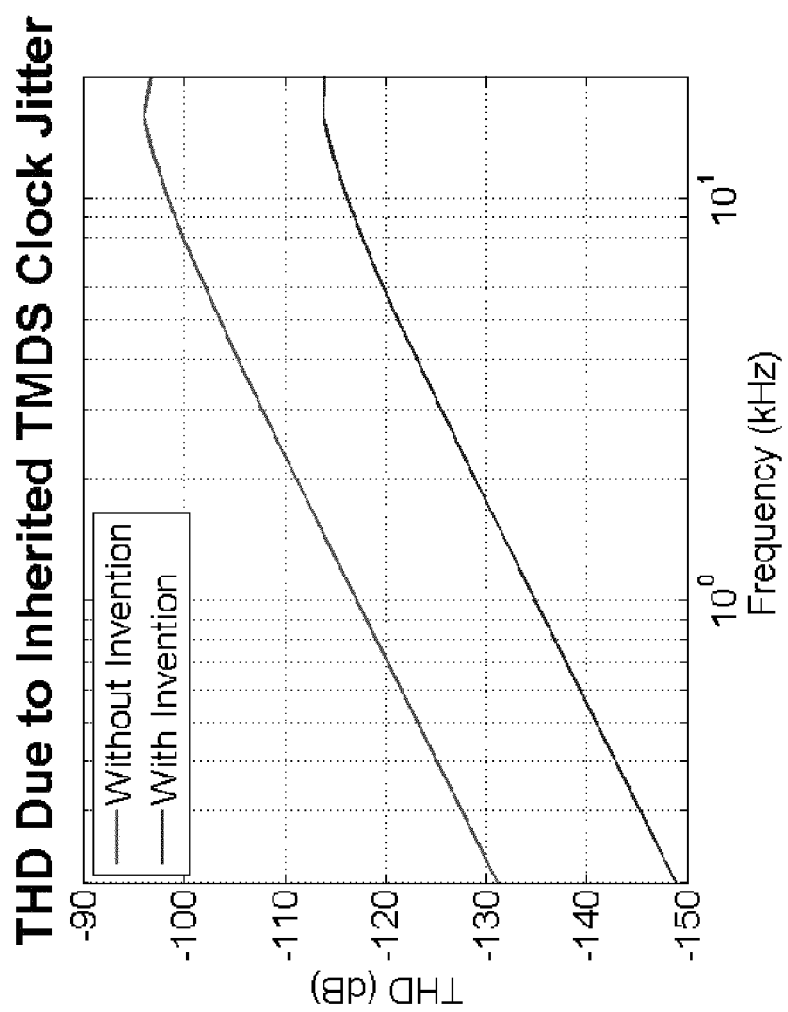
FIG. 7 illustrates the performance gain achievable by the present invention.

The HDMI standard suggests a sink implementation for generating the audio DAC clock as shown in FIG. 3, which is a copy of FIG. 7-2 in HDMI Specification revision 1.4b. Specifically, the TMDS Clock is received and divided down by a parameter called Cycle Time Stamp (CTS) that is negotiated between the sink and source via a side communication channel. The CTS-divided clock is then multiplied up by a factor of N (conveyed from the source to the sink via a side channel) in the phase-locked-loop (PLL) composed of the blocks: Phase Detector, Low-Pass Filter, Voltage Controlled Oscillator (VCO), and Divide-by-N as shown in FIG. 3. The output of the VCO is then a clock of frequency N/CTS times the TMDS clock, where N and CTS are chosen to produce a clock that is 128 times the audio DAC clock frequency ($f_s$).

The HDMI standard (up to at least revision 1.4b) specifies the frequency of the TMDS Clock to be in the range of 25 to 340 MHz with the particular rate depending on video resolution, color depth, and frame rate. Section 7.2 of the HDMI specification discusses the choice of the parameters N and CTS, and in particular, it discusses that CTS should be chosen so that the CTS-divided clock should be approximately 1 kHz with explicit recommendations for doing so in Tables 7-1, 7-2, and 7-3. A problem with this approach however is that when the 25 to 340 MHz TMDS Clock is divided down to approximately 1 kHz, all the phase noise or jitter will also alias or fold over down to the lower spectrum. In other words, the phase noise or jitter will alias down into the middle of the audible spectrum of 20 Hz to 20 kHz of human hearing. Furthermore, because the frequency of the phase noise or jitter is now extremely low (on the order of 1 kHz), it is impractical for the subsequent N-PLL in FIG. 3 to reduce the incoming jitter as that would require a low-pass filter with a bandwidth much less than 1 kHz. Using such a low bandwidth filter would introduce significant amounts of noise or jitter from the VCO as known to those skilled in the art.

Thus, a conventional HDMI system can suffer from distorted audio by mapping or "folding" jitter on the TMDS clock down into the audible frequency range on the audio DAC clock. This jitter on the TMDS clock can be caused by noise emanating from the source clock circuit, source Power Supply, Sink power supply or by distortion (skew, jitter, attenuation) of the clock caused by the cable. In some cases the noise can also be caused by noise in the sink system or local noise in the cable environment coming from external sources of Radio Frequency (RF) interference.

Figure 4:
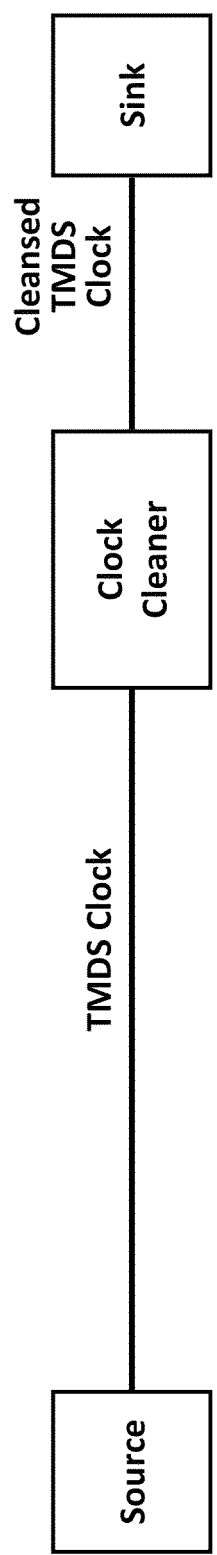
FIG. 4 illustrates one embodiment of the present invention.

Embodiments of the present invention include a method and system for reducing the jitter on the audio DAC clock by reducing the jitter on the incoming TMDS Clock to an HDMI sink. As shown in FIG. 4, one embodiment of the present invention is to strategically place a clock cleaning device, such as a PLL, in the signal path anywhere between the source and the sink, and in particular, prior to the HDMI audio receiver illustrated in FIG. 3. By strategically placing the clock cleaning device before the CTS-divider of the conventional HDMI audio receiver, the present invention can reduce the jitter on the TMDS clock before it is aliased down to a low frequency (such as 1 kHz) after which clock cleaning becomes impractical due to the excessive VCO phase noise that would arise due to the use of a lower PLL low-pass filter. This allows the present invention to reduce the clock jitter without introducing significant jitter from its own VCO since its associated low-pass filter can be of much higher frequency.

Figure 5:
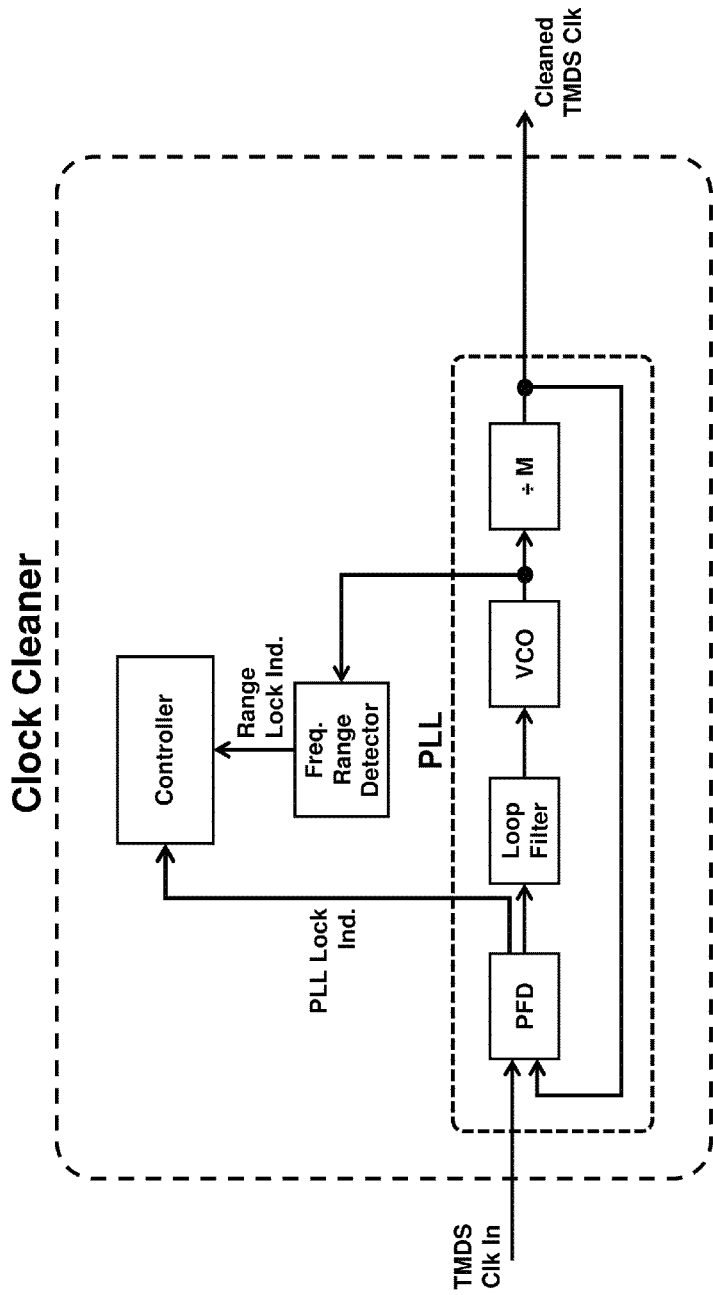
FIG. 5 illustrates a clock cleaner according to one embodiment of the present invention.

An exemplary embodiment of the present invention is shown in FIG. 5 where in addition to the PLL that takes in the TMDS Clock and outputs a cleansed TMDS Clock, the PLL also operates at an overclocked rate. In particular, the VCO in the clock cleaner oscillates at a frequency M times faster than the input TMDS clock. For example, if the TMDS input clock is 25 MHz and M is 136, then the VCO oscillates and produces a clean low-jitter clock at 3.4 GHz. This cleansed 3.4 GHz clock is then divided back down by M=136 to produce a lower jitter clock (equal in steady-state frequency to the input clock) as the cleansed TMDS clock. Operating the VCO at the higher frequency has several advantages. One is that lower jitter can be achieved due to the use faster frequency and associated smaller unit interval. Another advantage is that the PLL can be implemented with smaller components. If the VCO is based on a ring oscillator, a physically smaller and lower power ring oscillator can be used because smaller delays can be used. If VCO is based on an LC (inductor-capacitor) tank, then the resonant frequency can be implemented with smaller inductors and capacitors.

In the exemplary embodiment shown in FIG. 5, the frequency scaling factor M can be dynamically controlled within the clock cleaning device. In particular, a Frequency Range Detector processing block can measure the frequency output from the VCO. Then, by observing the frequency, the scaling factor can be adjusted until the VCO is operating at a preferred frequency. As previously mentioned, the TMDS clock frequency can vary from 25 MHz to 13.6 times that (i.e. 340 MHz). To have a low-jitter VCO (without scaling) span such a wide normalized frequency range is not practical. However, by dynamically adjusting the frequency scaling factor, a near-constant VCO frequency can be maintained. For example, the VCO can be run at 3.4 GHz with M=136 when the TMDS clock is 25 MHz, and it can also be run at 3.4 GHz with M=10 when the TMDS clock is 340 MHz. Similarly, the VCO can be run at or near 3.4 GHz for other TMDS clock frequencies by adjusting the frequency scaling factor M. While FIG. 5 draws the input of the frequency range detector from the output of the VCO, it is within the scope of the present invention to assess the frequency range detection based on other nodes within the PLL such as after the divide-by-M block.

A variety of methods can be used to determine the correct frequency scaling factor M without deviating from the scope of the present invention. For example, in one exemplary embodiment of the present invention, a controller could observe both the lock status of the PLL and a "range lock indicator" from the frequency range detector to operate in the following manner:

1) A first test value for M could be set by the controller.
2) The controller would wait until the PLL lock indicator (provided by phase frequency detector PFD) declares lock.
3) The controller can examine the range lock indicator. If the VCO is not within a specified frequency range, then a new value of M is set by the controller, and the search/test process repeats by going to step 2.

Additionally, the frequency range lock indicator in step 3 may also indicate whether the VCO should be sped up or slowed down in order to move towards its optimal oscillation frequency, and the controller can adjust the scaling factor M accordingly.

Figure 6:
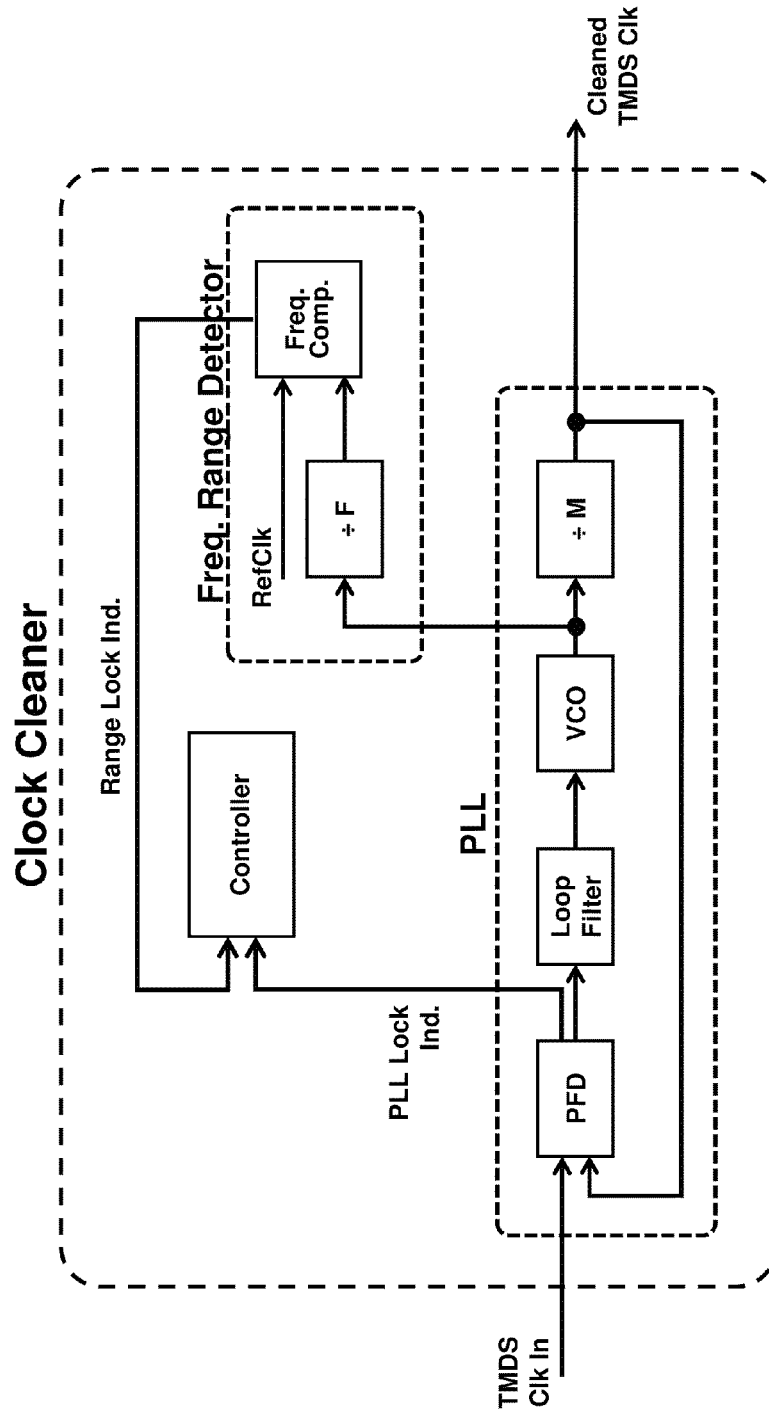
FIG. 6 illustrates a clock cleaner according to another embodiment of the present invention.

Those skilled in the art will recognize that the Frequency Range Detector could be implemented by a variety of means without deviating from the scope of the present invention. One such exemplary means for implementing the Frequency Range Detector is shown in FIG. 6. Here, the VCO output is divided by a second scaling factor F, and the frequency of the divide-by-F block is compared to a reference clock with a known stable frequency. The reference clock could come from a variety of sources, such as a trimmed RC (resistor-capacitor) oscillator or crystal oscillator. As an example, if a 20 MHz reference oscillator were used for the reference clock and the VCO were targeted for a 3.4 GHz oscillator frequency, then a dividing factor of F=170 could be used. Then, by comparing the frequency of the reference clock and the divide-by-F clock, a simple frequency comparator (such as an up-down counter) could be used to determine whether the divide-by-F clock were slower, faster, or about the same as the reference clock.

The exemplary embodiment described above has been modeled and simulated. The performance gain is illustrated by the improvement in total-harmonic-distortion (THD) as shown in FIG. 7. The lower THD when the present invention is included in the system quantifies the improvement in audio fidelity. The particular amount of the performance gain can vary depending on system variables such as source TMDS clock jitter than sink receiver implementation.

As previously noted, the present invention may be positioned in the signal path anywhere on the HDMI link after a conventional source transmitter circuit and before the sink receiver circuit. In a preferred embodiment, the device may be positioned in an active cable, dongle adapter, or in-line module so that a consumer can experience the improvement in audio fidelity in a minimally invasive manner, i.e. the purchase and simple insertion of an in-line device between the source and sink. Such a simple low cost remedy has obvious commercial advantages over requiring a consumer to modify the internal electrical circuitry of a source or sink device or purchase an expensive new source or sink. However, it is also within the scope of the present invention to implement the TMDS clock cleaning device in the source device after the transmitter circuit or in the sink device before the audio receiver illustrated in FIG. 3 whereby higher fidelity audio could be guaranteed in a source or sink device during design to yield a higher quality product.

Although the description has been described with respect to particular embodiments thereof, these particular embodiments are merely illustrative, and not restrictive.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

Particular embodiments may be implemented in a computer-readable storage medium for use by or in connection with the instruction execution system, apparatus, system, or device. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. An apparatus for reducing jitter in a clock signal in a digital transmission circuit, wherein the digital transmission circuit includes a source and a sink, the apparatus comprising:
    a clock cleaning device coupled between the source and the sink;
    wherein the clock cleaning device accepts as an input from the source a first TMDS clock signal characterized by a first jitter and a first frequency, and provides as an output to the sink a second TMDS clock signal characterized by a second jitter lower than the first jitter, and by a second frequency approximately equal to the first frequency.

2. The apparatus of claim 1, wherein the clock cleaning device includes a phase locked loop.

3. The apparatus of claim 1, wherein the clock cleaning device is coupled at an input to an HDMI audio receiver.

4. The apparatus of claim 3, wherein the clock cleaning device is coupled at an input to a CTS-divider of the HDMI audio receiver.

5. A method for reducing jitter in a clock signal in a digital transmission circuit, wherein the digital transmission circuit includes a source and a sink, the method comprising:
    coupling a clock cleaning device between the source and the sink;
    wherein the clock cleaning device accepts as an input from the source a first TMDS clock signal characterized by a first jitter and a first frequency, and provides as an output to the sink a second TMDS clock signal characterized by a second jitter lower than the first jitter, and by a second frequency approximately equal to the first frequency.

6. The method of claim 5, wherein the clock cleaning device includes a phase locked loop.

7. The method of claim 5, wherein the clock cleaning device is coupled at an input to an HDMI audio receiver.

8. The method of claim 7, wherein the clock cleaning device is coupled at an input to a CTS-divider of the HDMI audio receiver.

9. The apparatus of claim 2, wherein the phase locked loop includes a voltage controlled oscillator operating at a multiple M of the frequency of the clock signal from the source.

10. The apparatus of claim 9 wherein the clock cleaning device further includes:
    a frequency range detector configured to measure frequency at a node within the phase locked loop; and
    a controller configured to dynamically control the value of M in response to an output from the frequency range detector.

11. The apparatus of claim 10 wherein the node is at the output of the voltage controlled oscillator.

12. The apparatus of claim 10 wherein the controller is further configured to dynamically control the value of M in response to an output from a phase frequency detector included within the phase locked loop.

13. The apparatus of claim 10 wherein the frequency range detector includes a frequency comparator having one input from a reference clock and another input from a divide by F block operating on an output from the phase locked loop.

14. The method of claim 6, wherein the phase locked loop includes a voltage controlled oscillator operating at a multiple M of the frequency of the clock signal from the source.

15. The method of claim 14 wherein the clock cleaning device further includes:
    a frequency range detector configured to measure frequency at a node within the phase locked loop; and
    a controller configured to dynamically control the value of M in response to an output from the frequency range detector.

16. The method of claim 15 wherein the node is at the output of the voltage controlled oscillator.

17. The method of claim 15 wherein the controller is further configured to dynamically control the value of M in response to an output from a phase frequency detector included within the phase locked loop.

18. The method of claim 15 wherein the frequency range detector includes a frequency comparator having one input from a reference clock and another input from a divide by F block operating on an output from the phase locked loop.

* * * * *